United States Patent
Hasegawa et al.

(10) Patent No.: US 12,090,739 B2
(45) Date of Patent: Sep. 17, 2024

(54) METHOD FOR MANUFACTURING LAMINATED STRUCTURE AND METHOD FOR MANUFACTURING LIQUID EJECTION HEAD SUBSTRATE

(71) Applicant: CANON KABUSHIKI KAISHA, Tokyo (JP)

(72) Inventors: Kouji Hasegawa, Kawasaki (JP); Koji Sasaki, Nagareyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1084 days.

(21) Appl. No.: 16/944,648

(22) Filed: Jul. 31, 2020

(65) Prior Publication Data
US 2021/0046747 A1 Feb. 18, 2021

(30) Foreign Application Priority Data
Aug. 13, 2019 (JP) .................... 2019-148546

(51) Int. Cl.
B32B 37/14 (2006.01)
B41J 2/16 (2006.01)
C23C 14/00 (2006.01)
C23C 16/04 (2006.01)

(52) U.S. Cl.
CPC .......... *B32B 37/14* (2013.01); *B41J 2/1628* (2013.01); *B41J 2/1629* (2013.01); *C23C 14/001* (2013.01); *C23C 16/04* (2013.01)

(58) Field of Classification Search
None
See application file for complete search history.

(56) References Cited

U.S. PATENT DOCUMENTS

| | | | |
|---|---|---|---|
| 10,438,912 B2 | 10/2019 | Sasaki et al. | |
| 10,882,318 B2 | 1/2021 | Hasegawa et al. | |
| 2004/0191982 A1* | 9/2004 | Sasaki | H01C 17/281 29/830 |
| 2006/0055723 A1 | 3/2006 | Bell et al. | |
| 2019/0263123 A1* | 8/2019 | Hasegawa | H01L 21/32134 |

FOREIGN PATENT DOCUMENTS

| | | |
|---|---|---|
| JP | 2000-124457 A | 4/2000 |
| JP | 2018-154090 A | 10/2018 |
| JP | 6552660 B1 | 7/2019 |

OTHER PUBLICATIONS

Notice of Reasons for Refusal in Japanese Application No. 2019-148546 (Jun. 2023).

* cited by examiner

Primary Examiner — Michael N Orlando
Assistant Examiner — Abhishek A Patwardhan
(74) Attorney, Agent, or Firm — Venable LLP (57) ABSTRACT

A method for manufacturing a laminated structure, or a method for manufacturing a liquid ejection head substrate having an electrode pad, including: preparing a substrate on which a first layer is formed, foreign matter being present on a surface of the first layer; forming a mask layer on an entire area of a surface of the substrate, the surface of the substrate being provided with the first layer; removing at least a part of the foreign matter in a height direction by performing an etching treatment on the entire surface of the mask layer; and forming a second layer on a surface on which the etching treatment is performed, wherein the etching treatment is performed so that the foreign matter is not exposed from the second layer after forming the second layer.

5 Claims, 7 Drawing Sheets

METHOD FOR MANUFACTURING LAMINATED STRUCTURE AND METHOD FOR MANUFACTURING LIQUID EJECTION HEAD SUBSTRATE

BACKGROUND OF THE INVENTION

Field of the Invention

The present invention relates to a method for manufacturing a laminated structure such as a semiconductor substrate, and a method for manufacturing a liquid ejection head substrate.

Description of the Related Art

Japanese Patent Application Laid-Open No. 2018-154090 discloses that in the liquid ejection head substrate including an electrode pad including a wiring layer and an Au layer, Au is prevented from spreading toward the wiring layer due to heat or pressure when bonding an external connection portion to the electrode pad. In this liquid ejection head substrate, the wiring layer in a central portion of the electrode pad is removed to form an opening region, the Au layer is formed in an upper layer portion of the wiring layer including the opening region, and the external connection portion is bonded to an upper portion of the Au layer at a location corresponding to the opening region. Since the Au layer is provided in a region where the wiring layer is removed and bonding is performed in the region, Au is prevented from diffusing toward the wiring layer.

This document discloses that when a test probe is brought into contact with a surface of the wiring layer of the electrode pad to perform an electrical characteristic inspection, a probe trace (irregularities) is formed. Then, it is disclosed that, by removing the wiring layer when forming the opening region, in addition to an effect of preventing Au diffusion, it is possible to remove the probe trace and residue due to the test probe.

When foreign matter is present on the wiring layer, even if another layer such as a barrier metal layer or an Au layer is formed on the wiring layer, the foreign matter cannot be completely covered by the other layer and the foreign matter may be exposed. Exposure of the foreign matter may cause the wiring layer to corrode during subsequent processing. Therefore, it is desired to suppress influence of such foreign matter.

According to a method disclosed in Japanese Patent Application Laid-Open No. 2018-154090, regarding the central portion of the electrode pad, it is possible to suppress the influence of foreign matter on the wiring layer. However, on the wiring layer, not only foreign matter due to the probe trace or the like but also foreign matter such as etching residue generated when the wiring layer is formed may be present. The latter foreign matter may occur at random rather than at a specific location in the wiring layer. When there is randomly generated foreign matter, it is difficult to suppress the influence of foreign matter by the method disclosed in Japanese Patent Application Laid-Open No. 2018-154090.

An object of the present invention to provide a method for manufacturing a laminated structure capable of suppressing the influence of foreign matter present on the substrate without being limited to a specific location, and a method for manufacturing a liquid ejection head substrate.

SUMMARY OF THE INVENTION

According to one aspect of the present invention, there is provided a method for manufacturing a laminated structure including a first layer on a substrate and a second layer formed on the first layer, including: forming a mask layer on an entire area of a surface of the substrate, the surface of the substrate being provided with the first layer; removing at least a part of the foreign matter in a height direction by performing an etching treatment on the entire surface of the mask layer; and forming the second layer on a surface on which the etching treatment is performed, wherein the etching treatment is performed so that the foreign matter is not exposed from the second layer after forming the second layer.

According to another aspect of the present invention, there is provided a method for manufacturing a liquid ejection head substrate including an electrode pad that receives a driving power for ejecting a liquid from outside, the electrode pad including a first layer and a second layer formed on the first layer, including: preparing the substrate on which the first layer is formed, foreign matter being present on a surface of the first layer; forming a mask layer on an entire area of a surface of the substrate, the surface of the substrate being provided with the first layer; removing at least a part of the foreign matter in a height direction by performing an etching treatment on the entire surface of the mask layer; and forming the second layer on a surface on which the etching treatment is performed, wherein the etching treatment is performed so that the foreign matter is not exposed from the second layer after forming the second layer.

Further features of the present invention will become apparent from the following description of exemplary embodiments with reference to the attached drawings.

DESCRIPTION OF THE EMBODIMENTS

The present invention will be described below with reference to the drawings, but the present invention is not limited thereto. First, a laminated structure manufactured by a method for manufacturing a laminated structure according to an aspect of the present invention will be described. The laminated structure has a first layer on a substrate and a second layer formed on the first layer. Hereinafter, as the laminated structure, a semiconductor substrate used when manufacturing a semiconductor device will be described as an example.

Figure 1A:
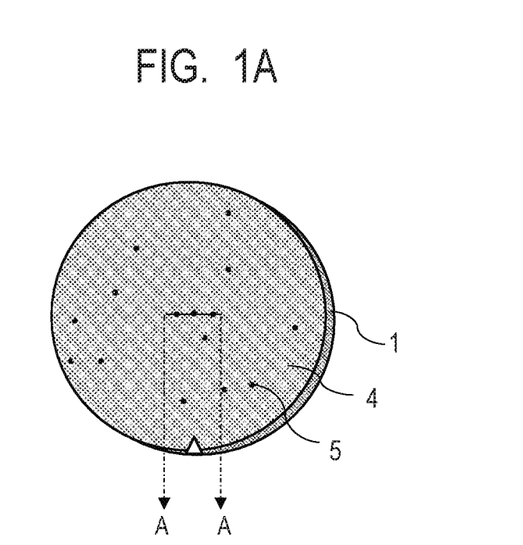
FIG. 1A is a schematic top view illustrating an example of a laminated structure manufactured by a method for manufacturing a laminated structure according to Embodiment 1 of the present invention.

FIG. 1A is a schematic top view of an example of the semiconductor substrate (note that before forming a film forming layer 6) manufactured by the method for manufacturing the laminated structure according to Embodiment 1 of the present invention. A mask layer 4 is formed on a silicon substrate 1, and a plurality of foreign matters 5 are scattered on the mask layer 4.

Figure 1B:
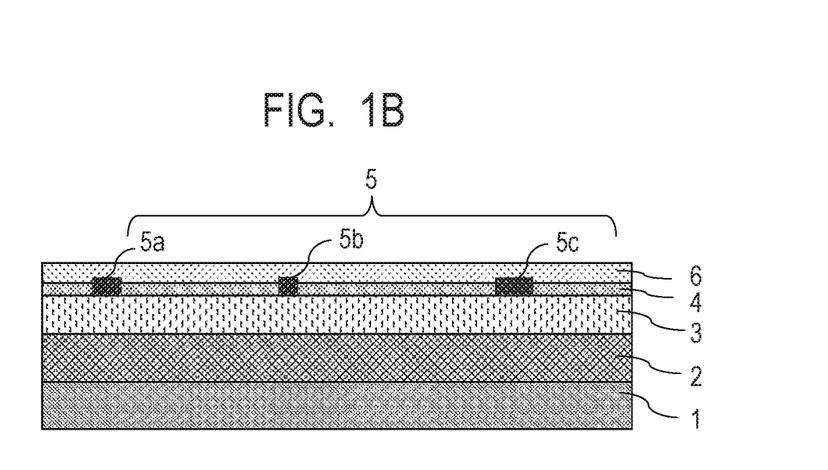
FIG. 1B is a schematic partial cross-sectional view illustrating the example of the laminated structure manufactured by the method for manufacturing the laminated structure according to Embodiment 1 of the present invention.

FIG. 1B is a schematic view of the semiconductor substrate (at a stage after forming the film forming layer 6) taken along a line A-A in FIG. 1A. A wiring layer 3 as the first layer is formed on the silicon substrate 1 through an insulating film 2. The mask layer 4 is formed on the wiring layer 3. Foreign matters 5 (5a to 5c) having different sizes and shapes are scattered on the mask layer 4. As will be described below in detail, the foreign matter 5 is removed using the mask layer 4 as a mask, however, the foreign matter 5 is foreign matter that remains even after removal. The foreign matter 5 is covered by forming the film forming layer 6 as the second layer on the mask layer 4. The first layer is not limited to the wiring layer, and may be an inorganic material layer such as SiO or SiN, an organic material layer such as an epoxy resin, or an electro-conductive layer such as TiW or Au.

The foreign matter 5 is a protruding object present on a surface of the first layer (wiring layer 3). One or a plurality of foreign matters 5 are present on a surface of the wiring layer 3. The foreign matter 5 is dust, for example, etching residue generated when the semiconductor substrate or a liquid ejection head substrate is manufactured, specifically when the wiring layer 3 or a layer under the wiring layer 3 is formed. Alternatively, a test probe may be brought into contact with the surface of the wiring layer 3 to inspect electrical characteristics of the substrate. At this time, the surface of the wiring layer 3 may rise due to contact with the test probe, and protrusion may be formed. Such protrusion is also the foreign matter 5. The foreign matter is typically a residue or so-called processing debris generated by processing in semiconductor manufacturing. However, there are other foreign matters due to various factors or substances, such as trash brought in from outside, dust, human skin, clothing fibers, fine particles floating in the atmosphere due to static electricity, and trash generated from semiconductor manufacturing equipment.

Figure 2:
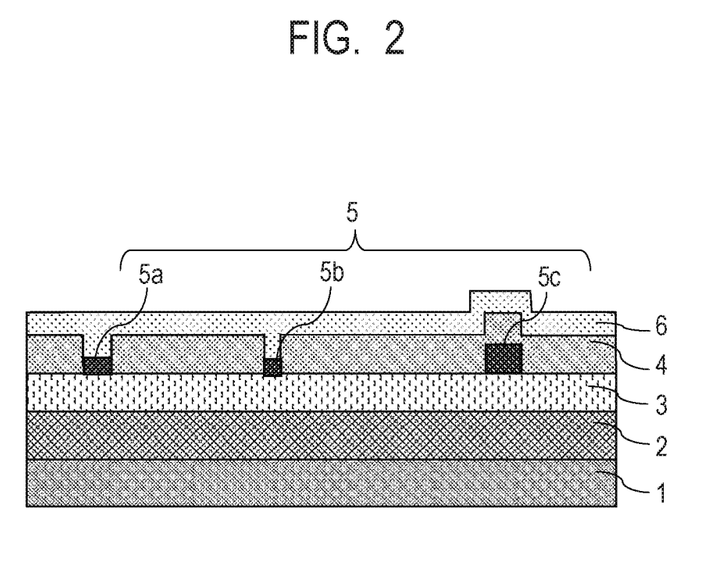
FIG. 2 is a schematic partial cross-sectional view of the example of the laminated structure manufactured by the method for manufacturing the laminated structure according to Embodiment 2 of the present invention.

FIG. 2 is a schematic cross-sectional view of a portion corresponding to an A-A cross-section in FIG. 1A of the example of the semiconductor substrate manufactured by the method for manufacturing the laminated structure according to Embodiment 2. As described below in detail, the foreign matter 5 is removed by a method different from that of Embodiment 1 in Embodiment 2. Therefore, forms of the foreign matter 5, the mask layer 4, and the film forming layer 6 are different from those of Embodiment 1.

Embodiment 1

Embodiment 1 of the method for manufacturing the laminated structure according to the present invention will be described in detail with reference to FIGS. 3A to 3D.

Figure 3A:
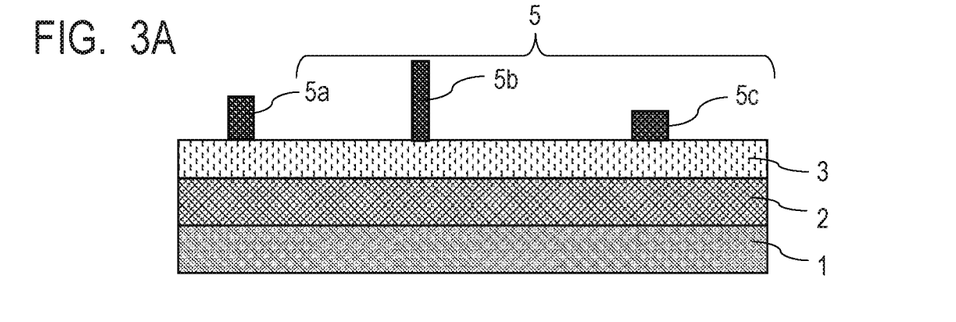
FIG. 3A is a schematic partial cross-sectional view for explaining the method for manufacturing the laminated structure according to Embodiment 1 of the present invention.

As illustrated in FIG. 3A, the insulating film 2 is formed on the silicon substrate 1 as the substrate. The insulating film 2 can be formed with a film thickness of about 500 nm, for example, by a CVD method. At this time, the insulating film can be formed in an appropriate pattern.

The insulating film 2 can be formed by using, for example, SiO, but is not particularly limited as long as it is an insulating material, and may be formed by using, for example, SiN.

Further, the wiring layer 3 is formed on the insulating film 2. In this way, the substrate on which the wiring layer 3 (first layer) is formed can be prepared.

The wiring layer 3 can be formed with a film thickness of about 200 nm, for example, by a sputtering method.

The wiring layer 3 can be formed using, for example, Al, however, its material is not particularly limited as long as it is, for example, an electro-conductive material having an electrical resistivity of $9 \times 10^{-8}$ Ωm or less. For example, the wiring layer 3 may be formed using gold, silver, copper or the like.

In order to form the wiring layer 3 in a pattern, for example, an etching mask can be formed with a resist by a photolithography method, and the film formed by sputtering can be etched. Thereafter, the resist and the etching residue can be removed by plasma ashing with $O_2$ and wet stripping.

The foreign matter 5 is formed on the wiring layer 3. The foreign matter 5 is formed on a surface when the wiring layer 3 is formed. The foreign matter 5 is, for example, an object that cannot be removed and remains when the plasma ashing with $O_2$ and the wet stripping are performed. As described above, the protrusion due to the inspection of the electrical characteristics of the wiring layer 3 can also be the foreign matter 5.

As the foreign matter 5, there are foreign matters 5a, 5b, and 5c having different sizes and shapes, and there are also substantially upright foreign matters and overhang-shaped foreign matters. The height of the foreign matter 5 is typically about 0.1 μm to 2.0 μm.

Figure 3B:
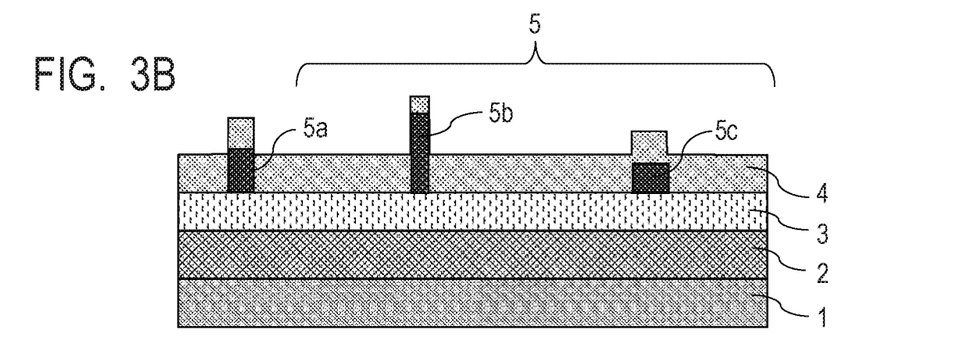
FIG. 3B is a schematic partial cross-sectional view for explaining the method for manufacturing the laminated structure according to Embodiment 1 of the present invention.

Subsequently, as illustrated in FIG. 3B, the mask layer 4 is formed on an entire are of a surface of the silicon substrate 1 on which the wiring layer 3 is formed. Therefore, the mask layer 4 is formed on the wiring layer 3 and the foreign matter 5. At this time, the foreign matters 5a and 5b have a portion that cannot be covered with the mask layer 4 and is exposed. On the other hand, the foreign matter 5c is covered with the mask layer 4 and is not exposed.

The mask layer 4 is used to suppress the wiring layer 3 from being removed when the foreign matter 5 is removed later by etching. The mask layer may be electro-conductive. When a part of the mask layer 4 remains after an etching treatment as described below, a remaining mask layer can be used for other purposes. For example, the mask layer 4 can be made of a material that can prevent diffusion to at least one of materials of the films (first layer and second layer) in contact with the mask layer 4.

The mask layer 4 can be formed with a film thickness of about 200 nm, for example, by the sputtering method or the CVD method. For example, TiW can be used for the mask layer 4. The material of the mask layer 4 is not particularly limited but, for example, Cr or Ni can be used.

Figure 3C:
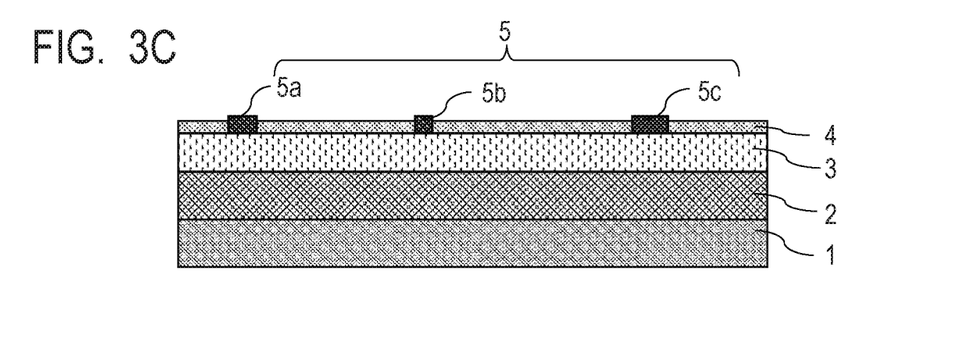
FIG. 3C is a schematic partial cross-sectional view for explaining the method for manufacturing the laminated structure according to Embodiment 1 of the present invention.

Subsequently, the entire surface of the mask layer 4 is subjected to the etching treatment to remove at least a part of the foreign matter 5 in its height direction. At this time, as illustrated in FIG. 3C, the etching treatment can be performed so that at least a part of the mask layer 4 remains in a thickness direction of the mask layer 4. That is, the mask layer 4 can be removed halfway in the thickness direction so that a removed portion does not reach the wiring layer 3. An upper portion of the foreign matter 5 is also removed halfway in the height direction of the foreign matter. The mask layer 4 and the foreign matter 5 can be removed by dry etching.

The etching treatment can be performed so that the mask layer 4 is entirely removed in the thickness direction of the mask layer 4. As a function of a dry etching device, there is a function of end point detection. This is a function of detecting a sudden change in etching rate and ending the etching treatment, when a type of the film to be etched changes. By appropriately using the function, even in a case where the mask layer is completely removed, the etching treatment can be finished when the etching reaches the wiring layer 3. Therefore, influence on the wiring layer 3 is limited, and it is possible to prevent function as the wiring layer from being impaired.

For example, the film thickness of the mask layer 4 removed by the dry etching is about 150 nm, and the film thickness of the mask layer 4 remaining after the dry etching is about 50 nm. Gas used in the dry etching is, for example, $CF_4$ gas, but it is not particularly limited as long as the mask layer 4 and the foreign matter 5 can be removed, and for example, the gas mixed with $O_2$, $N_2$ or the like can also be used.

The protruding object such as the foreign matter 5 has a feature of being easily hit by plasma during the dry etching and the etching easily progressing, so that an etching amount is larger than that of the mask layer 4. Thus, the foreign matter 5 is selectively removed. As a dry etching treatment, a treatment in which an etching selection ratio of the foreign matter 5 to the mask layer 4 exceeds 1 is preferable. The selection ratio is preferably in a range of 1.1 to 15.0. For example, when the height of the foreign matter is 2.0 the etching with the selection ratio of about "1:15" can be performed using a mixed gas of $CF_4$ gas (flow rate 200 to 500 sccm) and $O_2$ gas (flow rate 50 to 200 sccm). Note that "sccm" represents the flow rate ($cm^3$/min) at 0° C. and 1 atmosphere.

At this time, the foreign matter does not have to be completely removed, but may be satisfactorily removed so as not to be exposed from the film forming layer 6 when film formation or resist formation is performed, that is, after the film forming layer (second layer) 6 is formed. The foreign matter may be completely removed.

Figure 3D:
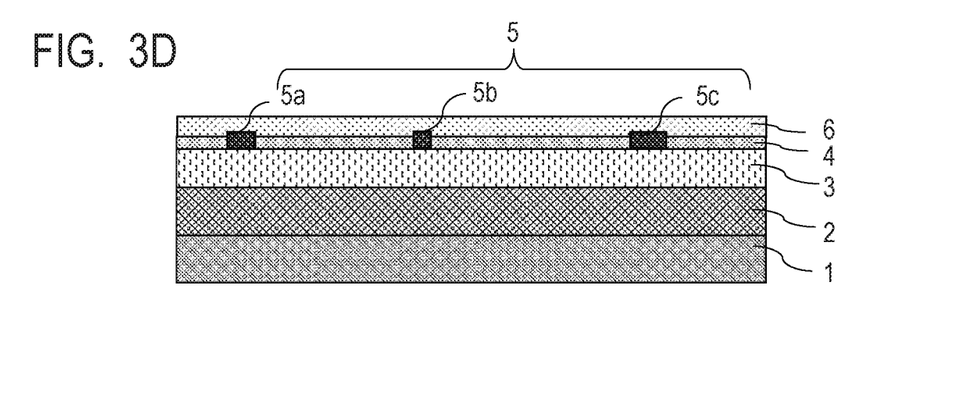
FIG. 3D is a schematic partial cross-sectional view for explaining the method for manufacturing the laminated structure according to Embodiment 1 of the present invention.

Subsequently, as illustrated in FIG. 3D, the film forming layer 6 is formed on the mask layer 4 and the foreign matter 5. At this time, the mask layer 4 and the foreign matter 5 are covered with the film forming layer 6 without being exposed.

Although an electro-conductive film can be used as the film forming layer 6, a film of a resin material such as photoresist may be formed. For example, TiW or Au can be used for the electro-conductive film. As the resin material, for example, "PMER" (trade name, manufactured by Tokyo Ohka Kogyo Co., Ltd.) or "HIMAL" (trade name, manufactured by Hitachi Chemical Co., Ltd.) can be used. However, the film forming layer 6 as the second layer is not limited to these, but can be various layers used, for example, in a semiconductor manufacturing treatment. Another layer can be further provided on the film forming layer 6. For example, when the film forming layer 6 is made of photoresist, the film forming layer 6 can also be removed later.

The laminated structure (semiconductor substrate) is completed by the above manufacturing method. According to the method, regardless of location of the foreign matter present, the foreign matter present on the first layer (foreign matter generated when the electrode layer is formed) can be easily removed to a height not exposed on a surface of the second layer.

Specific Example of Embodiment 1

For example, when performing the dry etching on the foreign matter having a height of 2.0 μm, the mask layer 4 is formed with a thickness of 200 nm, and then the etching can be performed using the mixed gas of $CF_4$ gas (flow rate 200 to 500 sccm) and $O_2$ gas (flow rate 50 to 200 sccm). Thus, for example, the thickness of the mask layer 4 can be 50 nm and the height of the foreign matter can be 100 nm. Thereafter, the film forming layer 6 can be formed to have a thickness of, for example, 100 nm. Since it is necessary to increase the thickness of the film forming layer 6 as the height of the foreign matter after etching is higher, the height of the foreign matter after etching is preferably suppressed to 100 nm or less (protrusion height of 50 nm or less from the mask layer).

Embodiment 2

Figure 4A:
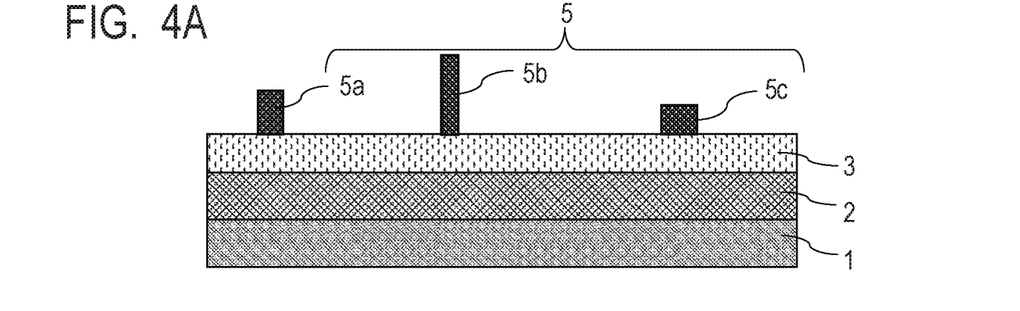
FIG. 4A is a schematic partial cross-sectional view for explaining the method for manufacturing the laminated structure according to Embodiment 2 of the present invention.
Figure 4B:
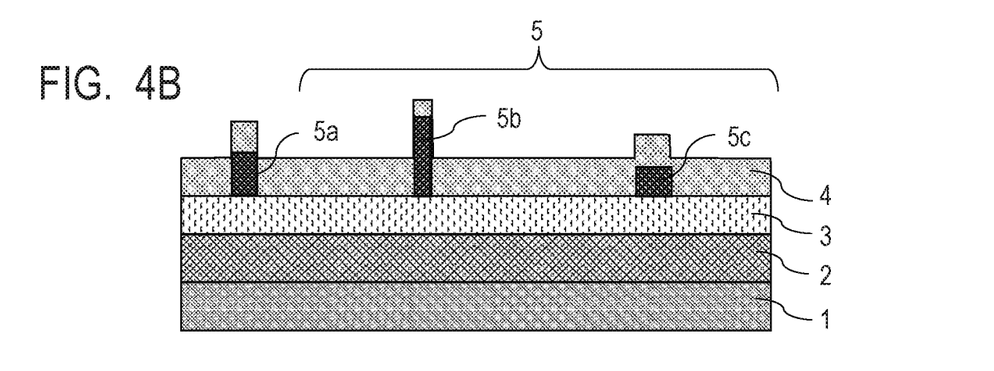
FIG. 4B is a schematic partial cross-sectional view for explaining the method for manufacturing the laminated structure according to Embodiment 2 of the present invention.

Embodiment 2 of the method for manufacturing the laminated structure according to the present invention will be described in detail with reference to FIGS. 4A to 4D. FIGS. 4A and 4B are the same as FIGS. 3A and 3B, and in the present embodiment, steps up to formation of the mask layer 4 are the same as those in Embodiment 1. Therefore, description of the steps up to the formation of the mask layer 4 will be omitted.

Figure 4C:
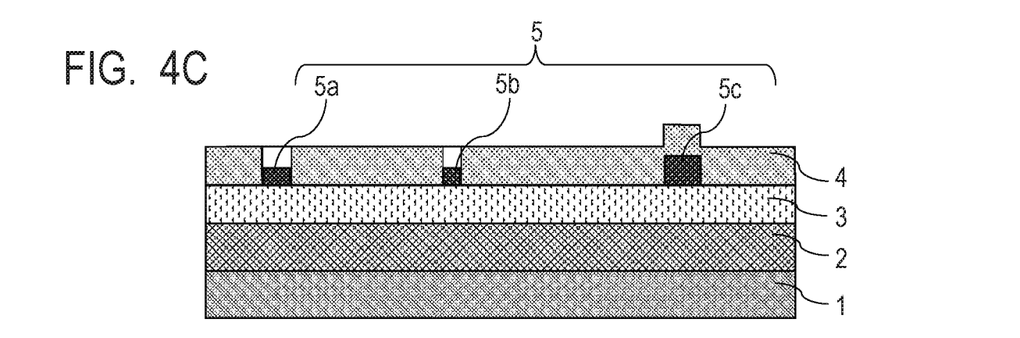
FIG. 4C is a schematic partial cross-sectional view for explaining the method for manufacturing the laminated structure according to Embodiment 2 of the present invention.

Subsequent to the formation of the mask layer 4, the entire surface of the mask layer 4 is subjected to the etching treatment to remove at least a part of the foreign matter 5 in the height direction. At this time, as illustrated in FIG. 4C, the foreign matters 5a and 5b having exposed portions not covered with the mask layer 4 are removed halfway in the thickness direction. Along with this, the mask layer present on the foreign matters 5a and 5b is removed. On the other hand, the mask layer 4 other than the mask layer present on the foreign matters 5a and 5b is not removed. The foreign matter 5c covered with the mask layer 4 remains without being etched. Therefore, a location where the foreign matter 5c is present is higher than other locations. The foreign matter 5 can be removed by wet etching.

A solution obtained by mixing acetic acid and phosphoric acid can be used for the wet etching. However, the solution is not limited to this, and an etching solution having the etching selection ratio of the foreign matter to the mask layer of more than 1 can be appropriately used, including the etching solution that can remove the foreign matter 5 and does not erode the mask layer 4. As the etching solution, for example, "NMD-3" (trade name, manufactured by Tokyo Ohka Kogyo Co., Ltd.), "ZE259" (trade name, manufactured by Hayashi Pure Chemical Ind., Ltd.) and the like can be used.

At this time, it is not necessary to completely remove the foreign matter having the exposed portion not covered with the mask layer 4, but may be satisfactorily removed so as not to be exposed from the film forming layer 6 when the film formation or the resist formation is performed, that is, after the film forming layer (second layer) 6 is formed. The foreign matter having the exposed portion not covered with the mask layer 4 may be completely removed.

Figure 4D:
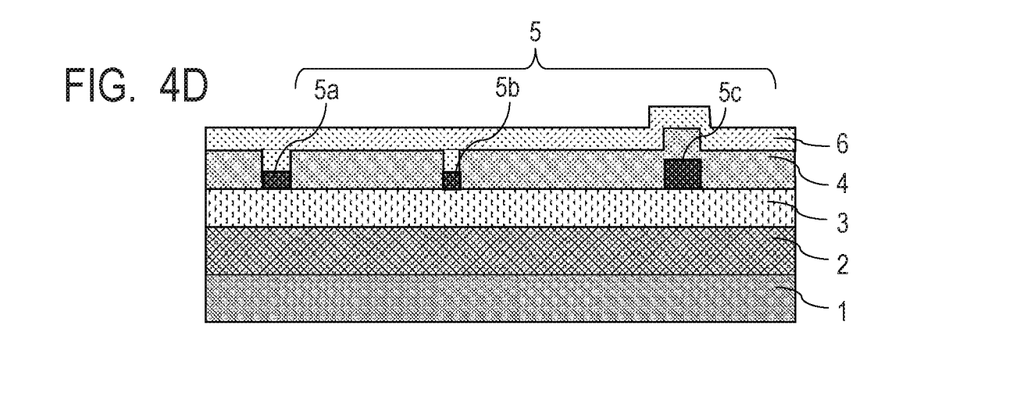
FIG. 4D is a schematic partial cross-sectional view for explaining the method for manufacturing the laminated structure according to Embodiment 2 of the present invention.

Subsequently, as illustrated in FIG. 4D, the film forming layer 6 is formed on the mask layer 4 and the foreign matter 5. At this time, the mask layer 4 and the foreign matter 5 are covered with the film forming layer 6 without being exposed. The location where the foreign matter 5c is present is higher than the other locations. The film forming layer 6 can be formed as in Embodiment 1.

The laminated structure (semiconductor substrate) is completed by the above manufacturing process. According to the method, the foreign matter that needs to be removed can be selectively removed depending on a state of the foreign matter.

Specific Example of Embodiment 2

For example, when performing the wet etching on the foreign matter having a height of 2.0 μm, the mask layer 4 is formed with a thickness of 200 nm, and then the etching can be performed for about 15 minutes using the etching solution (for example, NMD-3). Thus, for example, the thickness of the mask layer remains 200 nm and the height of the foreign matter can be 100 nm. Thereafter, the film forming layer 6 can be formed to have a thickness of, for example, 100 nm. In this case, since the film thickness of the mask layer is not reduced, the height of the foreign matter after etching is preferably suppressed to 250 nm or less (protrusion height of 50 nm or less from the mask layer).

Embodiment 3

One embodiment of a method for manufacturing the liquid ejection head substrate according to another aspect of the present invention will be described as Embodiment 3. The method specifically relates to manufacture of electrode pads. Hereinafter, an inkjet head will be described as an example of the liquid ejection head.

Figure 5A:
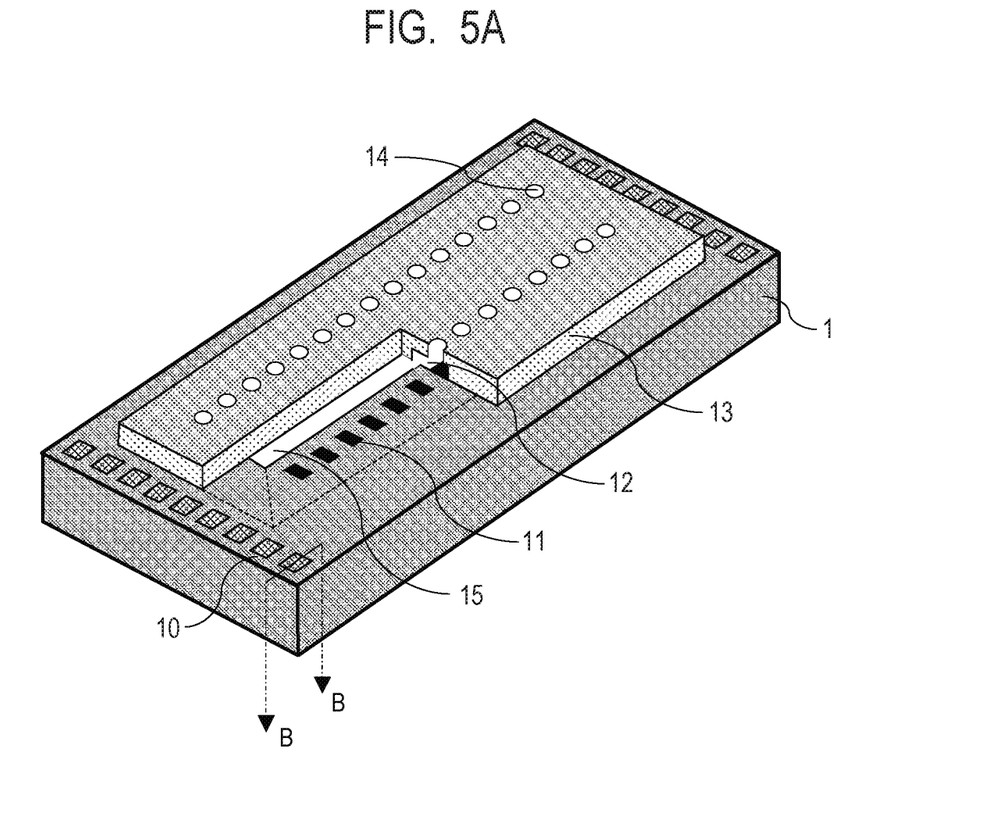
FIG. 5A is a schematic perspective view illustrating an example of a liquid ejection head substrate manufactured by the method for manufacturing the liquid ejection head substrate according to Embodiment 3 of the present invention.
Figure 5B:
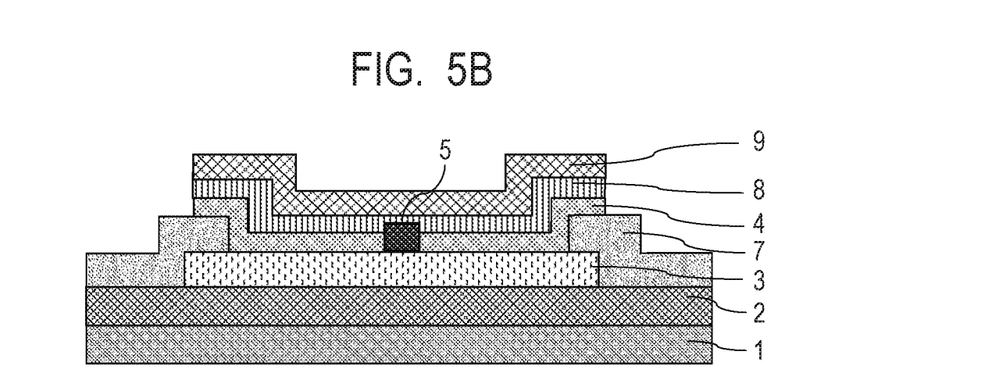
FIG. 5B is a schematic partial cross-sectional view illustrating the example of the liquid ejection head substrate manufactured by the method for manufacturing the liquid ejection head substrate according to Embodiment 3 of the present invention.

FIG. 5A is a schematic perspective view of an example of the liquid ejection head substrate manufactured by the method for manufacturing the liquid ejection head substrate according to Embodiment 3. FIG. 5B is a schematic view of a B-B cross-section in FIG. 5A.

As illustrated in FIG. 5A, on the silicon substrate 1, an electrode pad 10 that receives driving power for liquid ejection, that is, ink ejection from outside, and a nozzle resin material (flow path forming member) 13 are formed. Ink ejection openings 14 are formed in the nozzle resin material 13. An ink bubbling chamber 12 is formed inside the nozzle resin material 13. Inside the ink bubbling chamber 12, a heater 11 is formed as an energy generator that generates energy for ejecting ink. An ink supply port 15 is formed in the silicon substrate 1 so as to communicate with the ink bubbling chamber 12.

As illustrated in FIG. 5B, in the electrode pad, the wiring layer 3 as the first layer is formed on the silicon substrate 1 through the insulating film 2. A protective film 7 is formed so that a part of the wiring layer 3 is exposed. The mask layer 4 is formed on the wiring layer 3 and the protective film 7, and the foreign matter 5 is present on the wiring layer 3 and is surrounded by the mask layer 4. Although only one foreign matter 5 is illustrated in FIG. 5B, there are usually the plurality of foreign matters having different sizes and shapes. As will be described below in detail, the foreign matter 5 is removed using the mask layer 4 as the mask, however, the foreign matter 5 illustrated in FIG. 5B is the foreign matter that remains even after the removal. Further, a barrier metal layer 8 as the second layer is formed on the mask layer 4 and the foreign matter 5. An Au layer 9 is further formed on the barrier metal layer 8.

Hereinafter, the method for manufacturing the liquid ejection head substrate according to Embodiment 3 will be described. FIGS. 6A to 6F illustrate a portion corresponding to a portion illustrated in FIG. 5B.

Figure 6A:
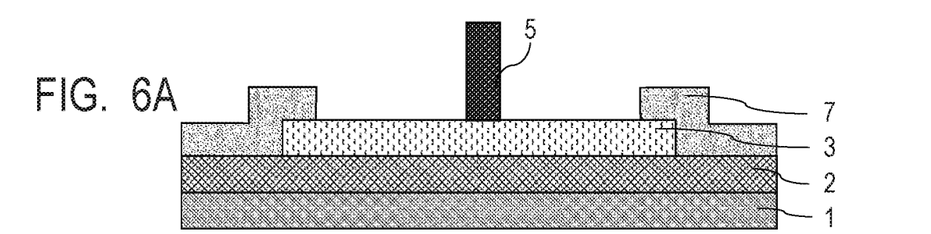
FIG. 6A is a schematic partial cross-sectional view for explaining the method for manufacturing the liquid ejection head substrate according to Embodiment 3 of the present invention.

As illustrated in FIG. 6A, the insulating film 2 is formed on the silicon substrate 1. The insulating film 2 can be formed, for example, as follows. That is, a film having a thickness of about 500 nm is formed by the CVD method, and then the resist is selectively formed (in a pattern) on the film by the photolithography method so as to serve as the etching mask, and the film is etched by a reactive ion etching method using $CF_4$. Subsequently, the insulating film 2 is formed by removing the resist and the etching residue by the plasma ashing with $O_2$ and the wet stripping.

The insulating film 2 can be formed by using, for example, SiO, but is not particularly limited as long as it is an insulating material, and may be formed by using, for example, SiN.

Further, the wiring layer 3 is formed on the insulating film 2. In this way, the substrate on which the wiring layer 3 (first layer) is formed can be prepared.

The wiring layer 3 can be formed, for example, as follows. That is, a film having a thickness of about 200 nm is formed by the sputtering method, and then the resist is selectively formed by the photolithography method so as to serve as the etching mask, and the film is selectively removed by the wet etching using the etching solution obtained by mixing acetic acid and phosphoric acid.

The wiring layer 3 can be formed using, for example, Al, however, its material is not particularly limited as long as it is, for example, an electro-conductive material having an electrical resistivity of $9 \times 10^{-8}$ Ωm or less. For example, the wiring layer 3 may be formed using gold, silver, copper or the like.

Further, the protective film 7 is formed so that a part of the wiring layer 3 is exposed.

The protective film 7 can be formed, for example, as follows. That is, a film having a thickness of about 500 nm is formed by the CVD method, and then the resist is selectively formed by the photolithography method so as to serve as the etching mask, and the film is etched by the reactive ion etching method using $CF_4$. Subsequently, the protective film 7 is formed by removing the resist and the etching residue by the plasma ashing with $O_2$ and the wet stripping. The protective film 7 can be formed using, for example, SiN, but is not particularly limited as long as it is a material that can protect the wiring material from erosion by the ink, and may be formed using, for example, SiO.

The foreign matter 5 is formed on the wiring layer 3. The foreign matter 5 is formed on a surface when the wiring layer 3 is formed. The foreign matter 5 is, for example, an object that cannot be removed and remains when the plasma ashing with $O_2$ and the wet stripping are performed. As described above, the protrusion due to the inspection of the electrical characteristics of the wiring layer 3 can also be the foreign matter 5.

As the foreign matter 5, there are the foreign matters having different sizes and shapes, and there are also substantially upright foreign matters and overhang-shaped foreign matters. The height of the foreign matter 5 is typically about 0.1 μm to 2.0 μm.

Figure 6B:
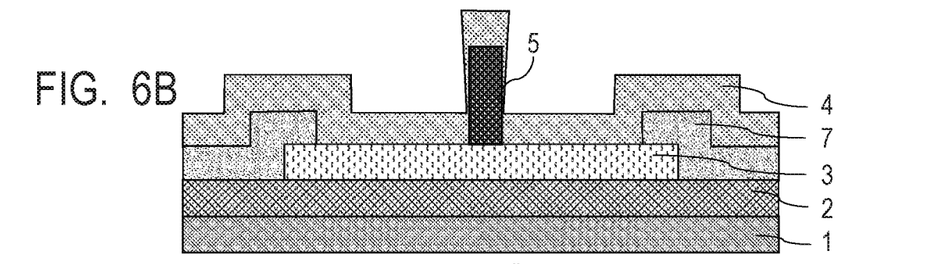
FIG. 6B is a schematic partial cross-sectional view for explaining the method for manufacturing the liquid ejection head substrate according to Embodiment 3 of the present invention.

Subsequently, as illustrated in FIG. 6B, the mask layer is formed on the entire area of a surface of the silicon substrate 1 on which the wiring layer 3 is provided. Therefore, the mask layer 4 is formed on the wiring layer 3, the foreign matter 5, and the protective film 7. At this time, the foreign matter 5 has the exposed portion not covered with the mask layer 4. Although only one foreign matter (corresponding to the above-mentioned foreign matters 5a and 5b) having the exposed portion is illustrated in this figure, a non-exposed foreign matter (corresponding to the above-mentioned foreign matter 5c) may be present as in Embodiment 1.

The mask layer 4 can be formed as in Embodiment 1. The mask layer 4 can be made of the material that can prevent diffusion to at least one of the materials of the films (first layer and second layer) in contact with the mask layer 4. At this time, the mask layer 4 can also serve as the barrier metal layer. In this case, the mask layer 4 can be made of metal or metal compound used for the barrier metal layer.

Figure 6C:
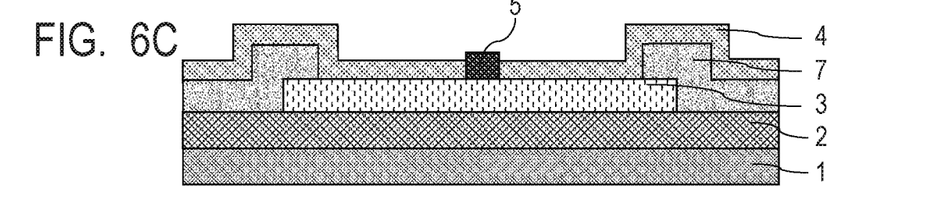
FIG. 6C is a schematic partial cross-sectional view for explaining the method for manufacturing the liquid ejection head substrate according to Embodiment 3 of the present invention.

Subsequently, the entire surface of the mask layer 4 is subjected to the etching treatment to remove at least a part of the foreign matter 5 in its height direction. At this time, as illustrated in FIG. 6C, the etching treatment can be performed so that at least a part of the mask layer 4 remains in the thickness direction of the mask layer 4. The upper portion of the foreign matter 5 is also removed halfway in the thickness direction. The mask layer 4 and the foreign matter 5 can be removed by a dry etching method as in Embodiment 1. The foreign matter 5 can be selectively removed by the dry etching as in Embodiment 1.

The removal of the foreign matter 5 is not limited to the dry etching, and the wet etching may be used. In the wet etching, the foreign matter 5 can be selectively removed by using the etching solution as in Embodiment 2.

It is not necessary to completely remove the foreign matter (having the exposed portion not covered with the mask layer 4) by etching, and the foreign matter may be satisfactorily removed so that it is not exposed from the second layer after the second layer (barrier metal layer 8) is formed. The foreign matter may be completely removed.

Figure 6D:
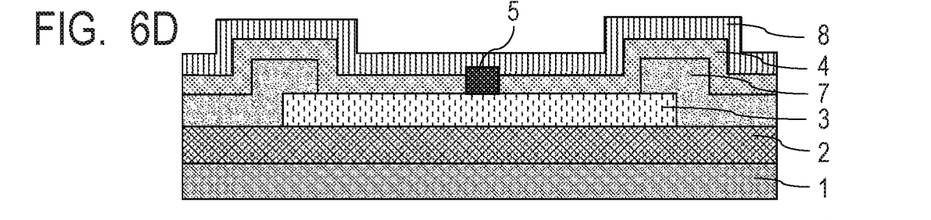
FIG. 6D is a schematic partial cross-sectional view for explaining the method for manufacturing the liquid ejection head substrate according to Embodiment 3 of the present invention.

Subsequently, as illustrated in FIG. 6D, a metal layer as the second layer, specifically the barrier metal layer 8 is formed on the mask layer 4, the foreign matter 5, and the protective film 7. The foreign matter 5 is covered with the barrier metal layer 8 without being exposed. The barrier metal layer 8 can be formed with a film thickness of about 200 nm, for example, by the sputtering method. The electro-conductive film can be used as the barrier metal layer 8, and for example, TiW, Cr, or Ni can be used. When the mask layer 4 and the barrier metal layer 8 are made of the same material and the mask layer 4 remains as illustrated in the figure, the remaining mask layer 4 and barrier metal layer 8 form a barrier metal layer.

Figure 6E:
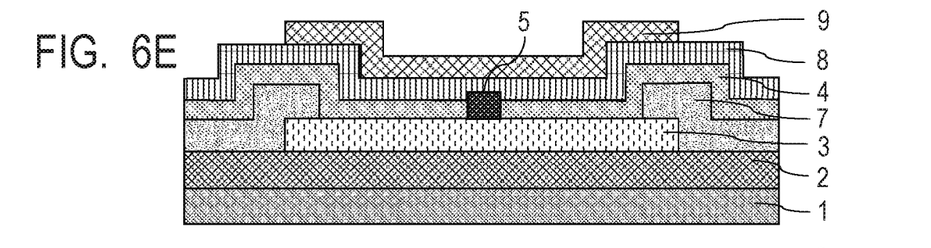
FIG. 6E is a schematic partial cross-sectional view for explaining the method for manufacturing the liquid ejection head substrate according to Embodiment 3 of the present invention.

Subsequently, as illustrated in FIG. 6E, the Au layer 9 is formed on the barrier metal layer 8. The Au layer 9 can be formed by forming Au into a film by the sputtering method and then forming it into a pattern using the photolithography method. The Au layer 9 has a thickness of, for example, 200 nm.

Figure 6F:
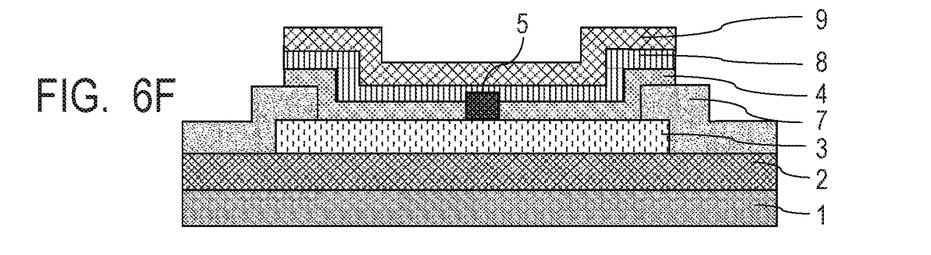
FIG. 6F is a schematic partial cross-sectional view for explaining the method for manufacturing the liquid ejection head substrate according to Embodiment 3 of the present invention.

Subsequently, as illustrated in FIG. 6F, a part of the mask layer 4 and a part of the barrier metal layer 8 are removed to expose a part of the protective film 7. The mask layer 4 and the barrier metal layer 8 can be removed, for example, by the wet etching using the Au layer 9 as the mask. For example, hydrogen peroxide solution can be used as the etching solution.

Thereafter, the Au layer 9 may be further processed by being exposed to a solvent. In this case, since the insulating film 2 and the wiring layer 3 are covered with the foreign matter 5 by the barrier metal layer 8, the solvent does not reach them so that they do not corrode.

In this way, the electrode pad can be formed. Before or after forming the electrode pad, the ink supply port 15 and the nozzle resin material 13 are appropriately provided so that the liquid ejection head substrate can be obtained.

The formation of the mask layer 4, the etching, and the formation of the second layer (barrier metal layer 8) can be performed in the same manner as in the specific example of Embodiment 1 or the specific example of Embodiment 2. From the viewpoint of foreign matter coverage and cost, the second layer is preferably the barrier metal layer rather than the Au layer.

Comparative Embodiment

Figure 7A:
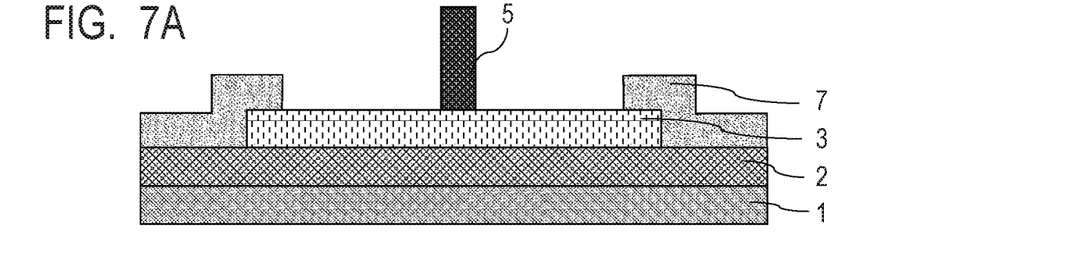
FIG. 7A is a schematic partial cross-sectional view for explaining the method for manufacturing the liquid ejection head substrate according to Comparative Embodiment.

The method for manufacturing the liquid ejection head substrate according to Comparative Embodiment will be described with reference to FIGS. 7A to 7D. FIGS. 7A to 7D illustrate the portion corresponding to the portion illustrated in FIG. 5B. FIG. 7A is the same as FIG. 6A, and in the present embodiment, the steps up to the formation of the protective film 7 are the same as those in Embodiment 3. Therefore, description of the steps up to the formation of the protective film 7 will be omitted.

Figure 7B:
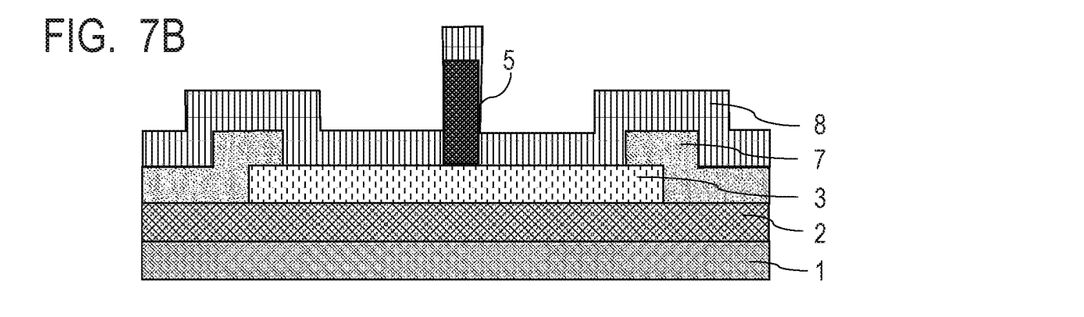
FIG. 7B is a schematic partial cross-sectional view for explaining the method for manufacturing the liquid ejection head substrate according to Comparative Embodiment.

Following the formation of the protective film 7, as illustrated in FIG. 7B, the barrier metal layer 8 is formed on the wiring layer 3, the foreign matter 5 and the protective film 7. At this time, the foreign matter 5 cannot be covered with the barrier metal layer 8 and is partially exposed.

The barrier metal layer 8 can be formed with a film thickness of about 200 nm, for example, by the sputtering method. For example, TiW can be used for the barrier metal layer 8.

Figure 7C:
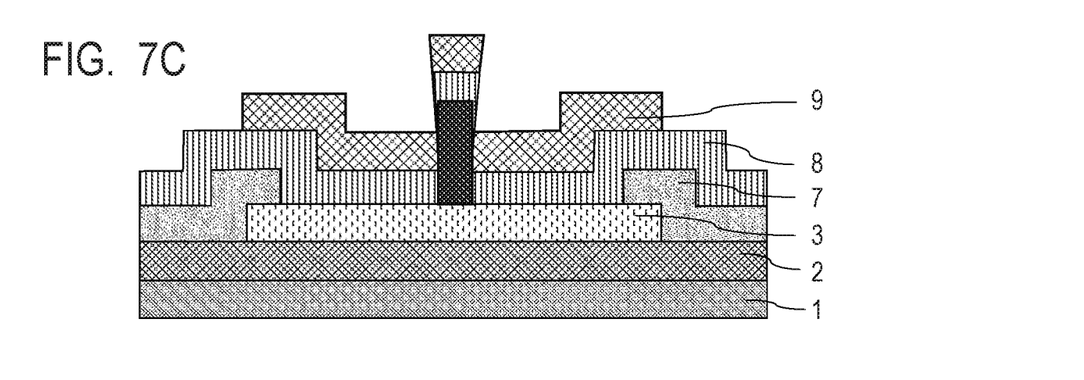
FIG. 7C is a schematic partial cross-sectional view for explaining the method for manufacturing the liquid ejection head substrate according to Comparative Embodiment.

Subsequently, as illustrated in FIG. 7C, the Au layer 9 is formed on the barrier metal layer 8. The Au layer 9 can be formed by forming Au into a film by the sputtering method and then forming it into a pattern using the photolithography method. The Au layer 9 has a thickness of, for example, 200 nm. At this time, the foreign matter 5 cannot be covered with the Au layer 9 and is partially exposed.

Figure 7D:
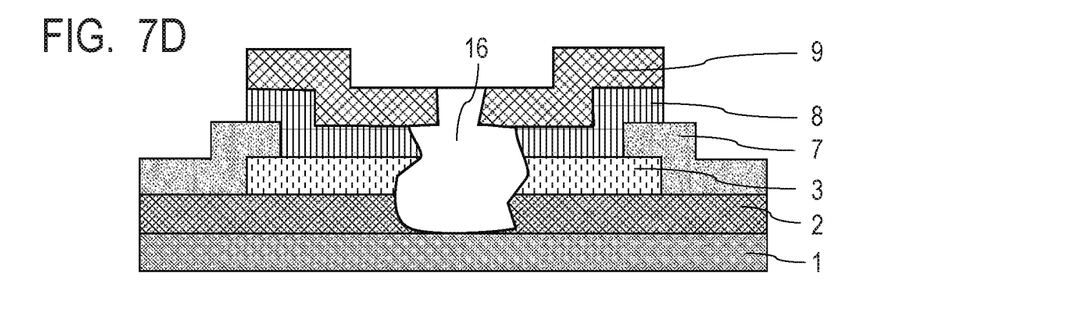
FIG. 7D is a schematic partial cross-sectional view for explaining the method for manufacturing the liquid ejection head substrate according to Comparative Embodiment.

Subsequently, as illustrated in FIG. 7D, a part of the barrier metal layer 8 is removed to expose a part of the protective film 7. The barrier metal layer 8 can be removed by the wet etching using, for example, the Au layer 9 as the mask. For example, the hydrogen peroxide solution can be used as the etching solution.

Subsequently, the Au layer 9 is further processed by being exposed to the solvent. At this time, the foreign matter 5 partially exposed is eroded by the solvent, and the solvent enters from there to corrode a part of the barrier metal layer 8, the wiring layer 3, and the insulating film 2. A cavity 16 is generated by corrosion. In this way, the foreign matter 5 may corrode the electrode pad and cause a defect. FIG. 7D illustrates a state after the corrosion.

As described above, according to the present invention, there is provided the method for manufacturing the laminated structure capable of suppressing the influence of the foreign matter present on the substrate without being limited to a specific location, and the method for manufacturing the liquid ejection head substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-148546, filed Aug. 13, 2019, which is hereby incorporated by reference herein in its entirety.

What is claimed is:

1. A method for manufacturing a laminated structure, comprising:
    a step A of forming an electro-conductive material layer against an insulating layer provided on a substrate along with forming a wiring layer in a pattern with a resist layer laminated against the electro-conductive material layer as a mask;
    a step B of removing the resist layer along with removing a residue formed on a surface of the wiring layer at a same time;
    a step C of forming a mask layer on a surface of the substrate where the wiring layer is formed, wherein the mask layer covers at least the wiring layer and at least a part of a foreign matter not removed in the removing of the residue formed on a surface of the wiring layer; and
    a step D of performing an etching treatment on the surface of the substrate where the mask layer is formed, wherein in the step D, the at least the part of the foreign matter covered with the mask layer is removed selectively halfway in a thickness direction thereof; and
    a step E of forming a film forming layer with an electro-conductive material or a resin material on the surface of the substrate on which the wiring layer containing the foreign matter to which the step D is performed is formed, wherein the mask layer and the foreign matter are covered with the film forming layer without being exposed from the film forming layer.

2. The method for manufacturing the laminated structure according to claim 1, wherein the mask layer is formed by a sputtering method or a CVD method.

3. The method for manufacturing the laminated structure according to claim 1, wherein the etching treatment in the step D is a dry etching treatment performed using a gas having an etching selection ratio of the foreign matter to the mask layer that exceeds 1, and wherein the foreign matter is etched together with the mask layer halfway in the thickness direction.

4. The method for manufacturing the laminated structure according to claim 1, wherein the mask layer is made of a material capable of preventing diffusion of at least one of materials forming the wiring layer and the film forming layer.

5. The method for manufacturing the laminated structure according to claim 1, wherein the etching treatment in the step D is a wet etching treatment performed using an etching solution having an etching selection ratio of the foreign matter to the mask layer that exceeds 1, and wherein the foreign matter a part of which is covered with the mask layer and another part of which is exposed from the mask layer is etched.

* * * * *